(12) United States Patent
Teng et al.

(10) Patent No.: US 8,531,175 B2
(45) Date of Patent: Sep. 10, 2013

(54) MONITORING DEVICE FOR AN ELECTRIC POWER SYSTEM

(75) Inventors: Jen-Hao Teng, Kaohsiung County (TW); Shang-Wen Luan, Kaohsiung County (KR); Chao-Shun Chen, Kaohsiung County (KR)

(73) Assignee: I-Shou University, Kaohsiung County (TW)

( * ) Notice: Subject to any disclaimer, the term of this patent is extended or adjusted under 35 U.S.C. 154(b) by 434 days.

(21) Appl. No.: 12/887,880

(22) Filed: Sep. 22, 2010

(65) Prior Publication Data

US 2011/0291695 A1  Dec. 1, 2011

(30) Foreign Application Priority Data

May 26, 2010 (TW) ................................ 99116851 A

(51) Int. Cl.
*G01R 19/00* (2006.01)
(52) U.S. Cl.
USPC ............... 324/76.11; 324/103 R; 324/764.01; 324/512; 324/522
(58) Field of Classification Search
CPC ...................................................... G01R 31/40
USPC ..... 73/512, 520–522, 535, 764.01; 324/512, 324/520–522, 535, 764.01, 76.11, 103 R
See application file for complete search history.

(56) References Cited

U.S. PATENT DOCUMENTS

| 4,428,021 A * | 1/1984 | Chen et al. ...................... 361/94 |
| 4,868,412 A * | 9/1989 | Owens .......................... 307/141 |
| 5,555,725 A * | 9/1996 | Shimasaki et al. .............. 60/277 |
| 6,597,180 B1 * | 7/2003 | Takaoka et al. ................ 324/512 |
| 6,894,478 B1 * | 5/2005 | Fenske .......................... 324/127 |
| 7,615,988 B2 * | 11/2009 | Blakely ......................... 324/127 |
| 7,973,543 B2 * | 7/2011 | Andoh et al. .................. 324/713 |
| 2001/0040446 A1 * | 11/2001 | Lapinksi et al. .............. 324/126 |

FOREIGN PATENT DOCUMENTS

TW  526335  4/2003

* cited by examiner

*Primary Examiner* — Hezron E Williams
*Assistant Examiner* — Hoang Nguyen
(74) *Attorney, Agent, or Firm* — Muncy, Geissler, Olds & Lowe, PLLC

(57) ABSTRACT

A monitoring device for an electric power system includes a detection unit and a display unit. The detection unit has a power module, a current detecting module and a transmission module. The power module includes positive and negative electrodes and is coupled to the current detecting module. The current detecting module includes a first switching unit and a second switching unit. The first and second switching units are coupled between the positive and negative electrodes to detect currents on detection points of the electric power system. The transmission module includes a micro-controller unit and a transmission device coupled to the micro-controller unit. The micro-controller unit includes a first end and a second end. The first end is coupled to the first switching unit and the second end is coupled to the second switching unit. The display unit is coupled to the transmission device for receiving signals from the detection unit.

4 Claims, 2 Drawing Sheets

MONITORING DEVICE FOR AN ELECTRIC POWER SYSTEM

BACKGROUND OF THE INVENTION

1. Field of the Invention

The present invention generally relates to a monitoring device for an electric power system and, more particularly, to a monitoring device for an electric power system which detects whether an abnormal current has occurred in the electric power system.

2. Description of the Related Art

Currently, transformer stations of electric power systems distributed over a wide area may be accessed by a monitoring center via various communication manners. However, human repair is still the most common way to repair the electric power systems as it would be costly to build such monitoring centers for maintenance purposes of the electric power systems. Besides, the modern electric power system has a much wider coverage, which makes it more costly for maintenance.

The modern electric power system has very complex wiring. In fact, electricity generated by power stations is delivered to the transformer stations via high voltage lines. Then, the electricity is delivered to destination areas by power distribution circuits of the transformer stations. The voltages received in the destination areas are then converted by pole mounted transformers into lower voltages to be provided to users. To maintain better service quality, power companies must regularly check the electric power system to fix or repair equipments or circuits that have been worn out. However, it will cost a lot for fixing or repairing the equipments or circuits, and it is also difficult to ensure good checking practice of the maintenance specialists. Furthermore, even regular inspection cannot prevent unexpected malfunctions of the electric power system that can happen anytime. As a result, it will be time-consuming for the maintenance specialists to find out when problems occur and their locations in the electric power system.

Taiwan Patent Number 526335 discloses an electric power system consisting of a plurality of branch stations. In the electric power system, each branch station has its own detection circuit for detecting abnormal operations thereof. The branch stations perform signal transmission via global positioning system (GPS) to rapidly locate places where errors have occurred. The located places are then transmitted to a map system of the electric power system in a wireless manner, which then further indicates the specific locations of the errors. In such a wireless transmission manner, a centralized monitoring center has been realized for monitoring the operation of the electric power system.

As the above mechanisms are significantly time-consuming (Based on significant time consumption of the above mechanisms), it is desired to develop a monitoring device for the electric power system which improves on the centralized monitoring center.

SUMMARY OF THE INVENTION

It is therefore the primary objective of this invention to provide a monitoring device for an electric power system which uses a detection unit to immediately issue an error message to a monitoring host when the electric power system operates abnormally, enabling maintenance specialists to obtain related information regarding the problems that have occurred based on the received error message, such as when or where the problems have taken place in the electric power system. Thus, the maintenance specialists can quickly solve the problems, thereby shortening the suspension time of the electric power system.

It is another objective of this invention to provide a monitoring device for an electric power system which allows maintenance specialists to quickly obtain information regarding problems that have occurred in the electric power system. Thus, fast analysis of the problems is achieved, reducing the labor cost required for maintaining the electric power system.

The invention discloses a monitoring device for an electric power system, which includes a detection unit and a display unit. The detection unit has a power module, a current detecting module and a transmission module. The power module includes positive and negative electrodes and is coupled to the current detecting module. The current detecting module includes a first switching unit and a second switching unit. The first and second switching units are coupled between the positive and negative electrodes to detect currents on detection points of the electric power system. The transmission module includes a micro-controller unit and a transmission device coupled to the micro-controller unit. The micro-controller unit includes a first end and a second end. The first end is coupled to the first switching unit to detect switching condition of the first switching unit and the second end is coupled to the second switching unit to detect switching condition of the second switching unit. The display unit is coupled to the transmission device and receives signals from the detection unit.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
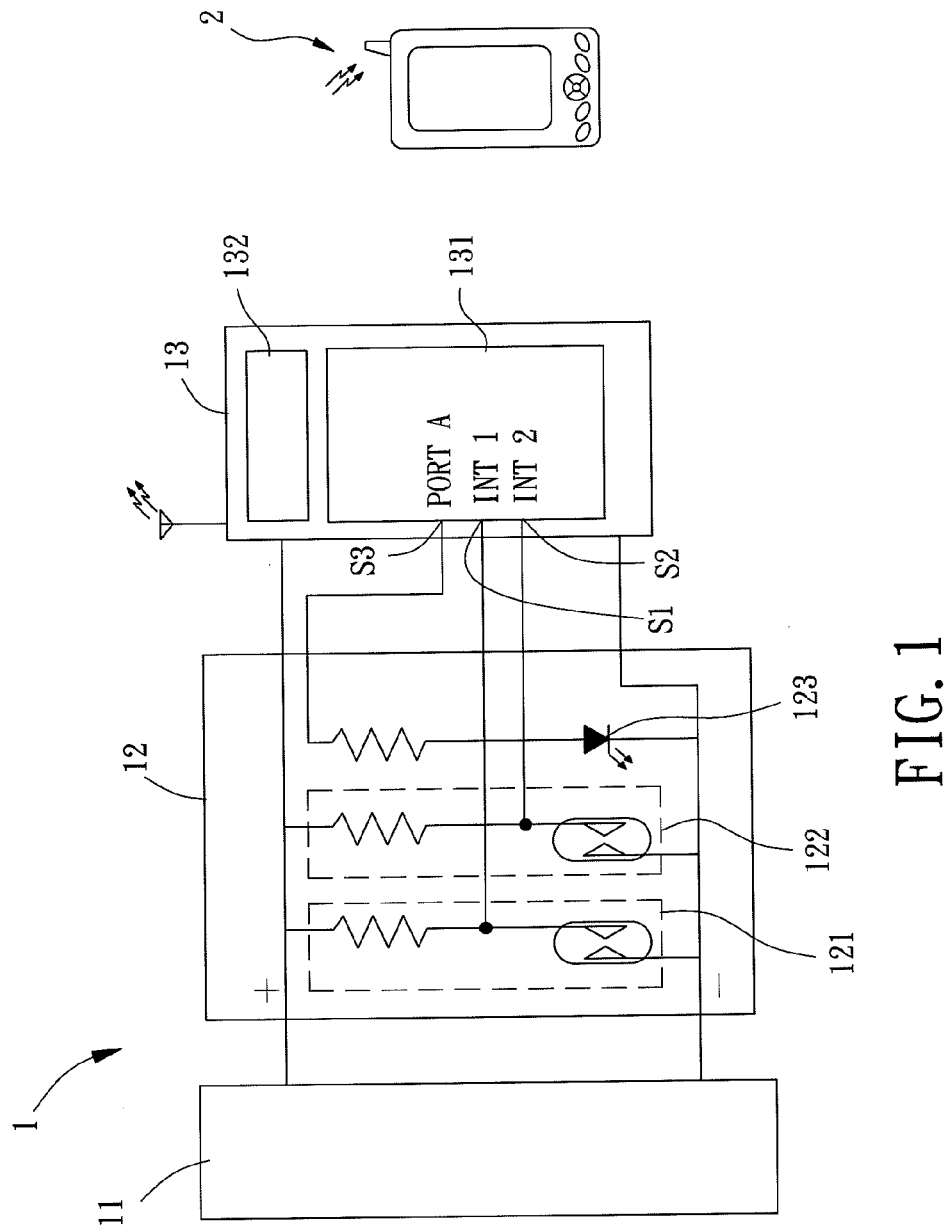
FIG. 1 shows a diagram of a monitoring device for an electric power system according to a preferred embodiment of the invention.

In the various figures of the drawings, the same numerals designate the same or similar parts. Furthermore, when the term "first", "second", "third", "fourth", "inner", "outer" "top", "bottom" and similar terms are used hereinafter, it should be understood that these terms refer only to the structure shown in the drawings as it would appear to a person viewing the drawings and are utilized only to facilitate describing the invention.

DETAILED DESCRIPTION OF THE INVENTION

Referring to FIG. 1, a monitoring device for an electric power system is disclosed according to a preferred embodiment of the invention. The monitoring device includes a detection unit 1 and a display unit 2. The detection unit 1 includes a power module 11, a current detecting module 12 and a transmission module 13. The power module 11 includes a positive electrode and a negative electrode. The power module 11 is electrically connected to the current detecting module 12 which, in turn, is electrically connected to the transmission module 13. The current detecting module 12 is used to detect a current on a detection point of the electric power system. The transmission module 13 is used to receive signals from the current detecting module 12 and transmits the received signals to the display unit 2. Specifically, the power module 11 is electrically connected to the current detecting module 12 for providing power thereto.

The current detecting module 12 includes a first switching unit 121, a second switching unit 122 and a lighting unit 123. The first switching unit 121 is electrically connected to the second switching unit 122 in parallel. Each of the first switching unit 121 and the second switching unit 122 has two ends electrically connected to the positive and negative electrodes of the power module 11. Each of the first switching unit 121 and the second switching unit 122 preferably consists of a magnetic reed switch and a resistor connected to the magnetic reed switch in series. The magnetic reed switch of the first switching unit 121 will be turned on when the current on the detection point is higher than a threshold (such as 1000 A), and will be turned off when the current on the detection point is lower than the threshold. The magnetic reed switch of the second switching unit 122 will be turned on when the current on the detection point is higher than a minimal restore current value (such as 12 A), and will be turned off when the current on the detection point is lower than the minimal restore current value. The lighting unit 123 has one end electrically connected to the negative electrode of the power module 11, and another end electrically connected to the transmission module 13. The lighting unit 123 is preferably a light-emitting diode (LED) or bulb.

The transmission module 13 includes a micro-controller unit (MCU) 131 and a transmission device 132. The micro-controller unit 131 includes a first end S1, a second end S2 and a third end S3. The first end S1 is electrically connected to the first switching unit 121 so that the switching condition of the first switching unit 121 may be detected. Preferably, the first end S1 is electrically connected to a node where the magnetic reed switch and the resistor of the first switching unit 121 are connected together. The second end S2 is electrically connected to the second switching unit 122 so that the switching condition of the second switching unit 122 may be detected. Preferably, the second end S2 is electrically connected to a node where the magnetic reed switch and the resistor of the second switching unit 122 are connected together. The third end S3 is electrically connected to the lighting unit 123. The transmission device 132 is electrically connected to the micro-controller unit 131 so that the transmission device 132 may transmit wired or wireless signals to the display unit 2 according to signals received from the micro-controller unit 131. The transmission device 132 may preferably be a Zigbee, a general packet radio service (GPRS), a global system for mobile communications (GSM), a power line carrier (PLC) or a fiber network. In such wired or wireless transmission manners, the display unit 2 may receive signals from the detection unit 1.

When the current on the detection point is not higher than the threshold, the first switching unit 121 will remain OFF. At this time, the first end S1 will detect a high-level voltage (logic "1") outputted by the positive electrode of the power module 11. In this case, the detection unit 1 will not operate and the second end S2 will be not enabled. However, the first switching unit 121 will be turned on when the current on the detection point is higher than the threshold. When this happens, the first end S1 will detect a low-level voltage (logic "0") outputted by the negative electrode of the power module 11. In this case, the micro-controller unit 131 will activate the transmission device 132 in order to transmit an error message to the display unit 2. At the same time, the third end S3 will output currents to drive the lighting unit 123. After a predetermined time period, the second end S2 will be enabled to detect the switching condition of the second switching unit 122. Under detection of the enabled second end S2, the second switching unit 122 will be turned on once the current on the detecting point is higher than the minimal restore current value. When this happens, the second end S2 may detect that the second switching unit 122 is ON, causing the third end S3 of the micro-controller unit 131 to stop providing currents to the lighting unit 123. Thus, the lighting unit 123 is shut down. In this instance, the second end S2 is also disabled. Besides, when the current on the detecting point is lower than the minimal restore current value, both the first switching unit 121 and the second switching unit 122 will remain OFF. In this regard, both the first end S1 and the second end S2 will detect a high-level voltage.

Figure 2:
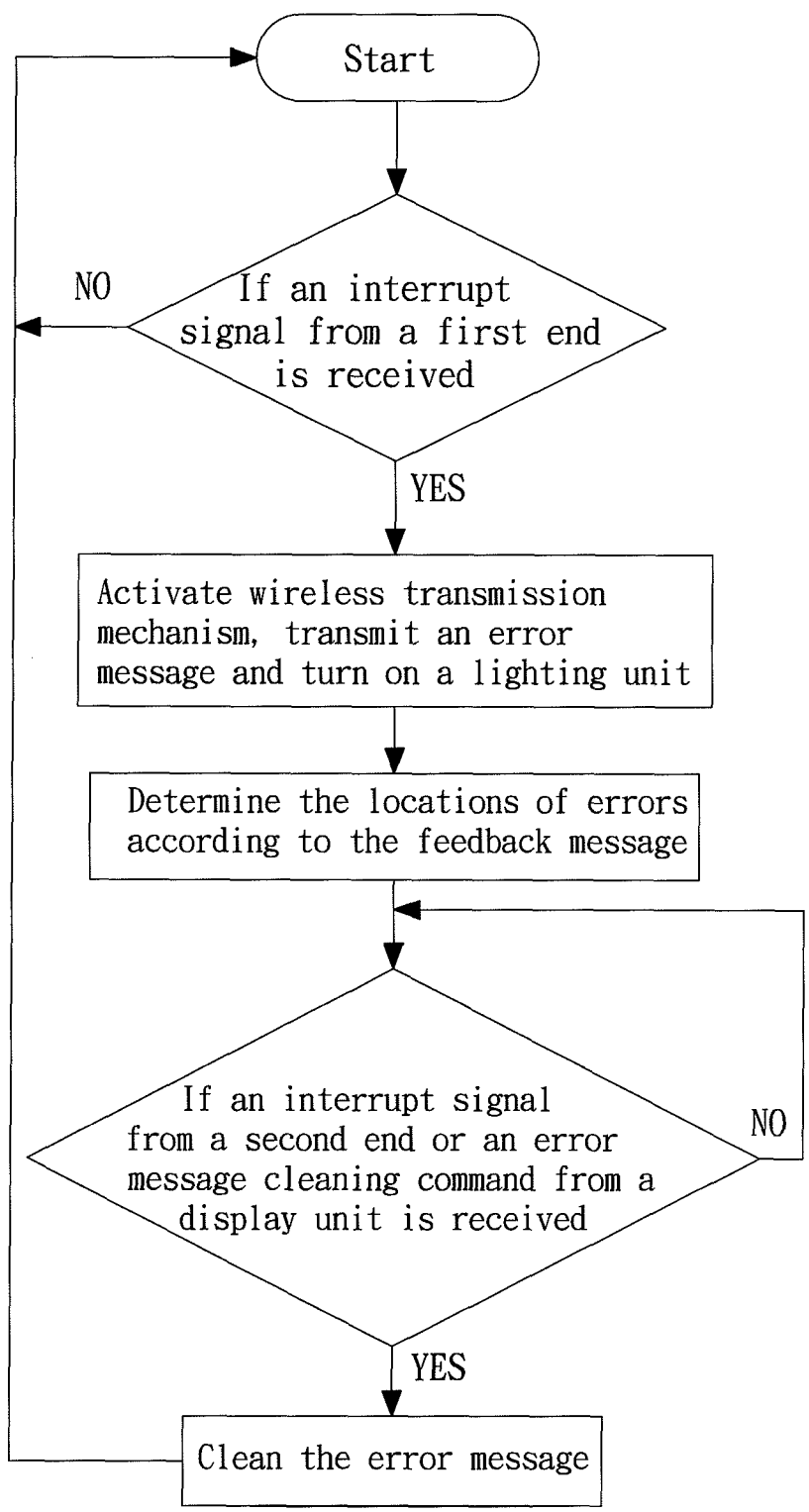
FIG. 2 shows an operation flowchart of the monitoring device according to the preferred embodiment of the invention.

Referring to FIGS. 1 and 2 again, the detection unit 1 is described in detail below.

When the electric power system operates in a normal condition, the current on the detection point of the electric power system is lower than the threshold. At this time, the first switching unit 121 remains OFF so that the first end S1 of the micro-controller unit 131 is not triggered. Thus, the detection unit 1 is not operated. In addition, since the second end S2 is not enabled, the switching condition of the second switching unit 122 will not be taken into consideration. Based on this, the micro-controller unit 131 only monitors the switching condition of the first switching unit 121 when the electric power system operates normally.

When the electric power system is broken, an abnormal current will occur. In this case, the current on the detection point of the electric power system is higher than the threshold so that the first switching unit 121 is turned on. Based on this, the first end S1 of the micro-controller unit 131 will detect a low-level voltage. In this regard, the micro-controller unit 131 determines that an error has occurred, and then activates the transmission device 132 to issue the error message to the display unit 2. Meanwhile, the third end S3 will output currents for driving the lighting unit 123. At the same time, the micro-controller unit 131 will enable the second end S2 after the first end S1 has been enabled for the predetermined time period (2 seconds preferred). Thus, the enabled second end S2 will determine whether the electric power system has gone back to normal operation by detecting whether the abnormal current has been cancelled.

When the electric power system is broken, the broken circuitry will be isolated from others by a protection mechanism of the electric power system. When the problem has been solved, the detecting points of the electric power system will have normal currents with a magnitude lower than the threshold but higher than the minimal restore current value. At this time, once the problem has been solved, the first switching unit 121 and the second switching unit 122 will remain OFF. Then, the detecting point will have normal currents so that the second switching unit 122 is turned on. As a result, the second end S2 of the micro-controller unit 131 will detect a low-level voltage so that the detection unit 1 determines that the electric power system has gone back to normal operation. In response, the micro-controller unit 131 stops the third end S3 from providing the currents to the lighting unit 123 and disables the second end S2. Thus, the detection unit 1 is returned to a normal condition. In addition, the third end S3 of the micro-controller unit 131 may automatically turn off the lighting unit 123 to save power if the electric power system is broken for more than a certain period of time, such as 30 minutes.

In conclusion, the monitoring device for the electric power system of the invention utilizes the first switching unit 121 and the second switching unit 122 of the current detecting module 12 to detect an abnormal current. When the problem is solved, the second switching unit 122 may be operated so that the detection unit 1 is returned to the normal operation. Besides, the display unit 2 may be used to show the error message, and the error message may also be cleared from the display unit 2. Furthermore, when the electric power system is broken, the detection unit 1 detects the abnormal current and delivers the error message to the display unit 2 in a wireless manner. Based on this, maintenance specialists may recognize the problems at once, thereby quickly repairing the electric power system. Thus, the electric power system may be maintained in an efficient way. In addition, information regarding the error may be shown by the display unit 2 in order for the maintenance specialists to rapidly analyze the problems. Thus, labor cost may be reduced.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A monitoring device for an electric power system, comprising:
    a detection unit having a power module, a current detecting module and a transmission module, wherein the power module includes positive and negative electrodes and is coupled to the current detecting module, the current detecting module includes a first switching unit and a second switching unit, each of the first and second switching units consists of a magnetic reed switch and a resistor connected to the magnetic reed switch in series, the first and second switching units are coupled between the positive and negative electrodes to detect currents on detection points of the electric power system, the transmission module includes a micro-controller unit and a transmission device coupled to the micro-controller unit, the micro-controller unit includes a first end and a second end, the first end is coupled to a node where the magnetic reed switch and the resistor of the first switching unit are connected together to detect switching condition of the first switching unit, and the second end is coupled to a node where the magnetic reed switch and the resistor of the second switching unit are connected together to detect switching condition of the second switching unit; and
    a display unit coupled to the transmission device for receiving signals from the detection unit.

2. The monitoring device for the electric power system as claimed in claim 1, wherein the transmission device is a Zigbee, a general packet radio service, a global system for mobile communications, a power line carrier or a fiber network.

3. A monitoring device for an electric power system, comprising:
    a detection unit having a power module, current detecting module and a transmission module, wherein the power module includes positive and negative electrodes and is coupled to the current detecting module, the current detecting module includes a first switching unit and a second switching unit, the first and second switching units are coupled between the positive and negative electrodes to detect currents on detection points of the electric power system, the transmission module includes a micro-controller unit and a transmission device coupled to the micro-controller unit, the micro-controller unit includes a first end and a second end, the first end is coupled to the first switching unit to detect switching condition of the first switching unit, the second end is coupled to the second switching unit to detect switching condition of the second switching unit;
    a display unit coupled to the transmission device for receiving signals from the detection unit; and
    a lighting module having one end coupled to the negative electrode of the power module and the other end coupled to the transmission module.

4. The monitoring device for the electric power system as claimed in claim 3, wherein the transmission device is a Zigbee, a general packet radio service, a global system for mobile communications, a power line carrier or a fiber network.

* * * * *